United States Patent [19]
Murphy et al.

[11] Patent Number: 5,428,495
[45] Date of Patent: Jun. 27, 1995

[54] ELECTRICAL SWITCHING APPARATUS WITH DIGITAL TRIP UNIT AND AUTOMATIC FREQUENCY SELECTION

[75] Inventors: William J. Murphy, Monroeville; Joseph C. Engel, Monroeville Boro; Alan B. Shimp, Monroeville; Gary F. Saletta, Penn Township, all of Pa.

[73] Assignee: Eaton Corporation, Cleveland, Ohio

[21] Appl. No.: 954,915

[22] Filed: Sep. 30, 1992

[51] Int. Cl.⁶ .................. H02H 3/26; H01H 47/20
[52] U.S. Cl. ....................... 361/85; 361/93; 307/129; 324/520; 324/76.11
[58] Field of Search ................ 361/42, 93, 94, 95, 361/96, 97, 98, 85, 78; 307/129; 324/520, 78 R

[56] References Cited

U.S. PATENT DOCUMENTS

| | | | |
|---|---|---|---|
| 4,019,097 | 4/1977 | Miller et al. | 361/94 |
| 4,025,821 | 5/1977 | Lang | 361/111 |
| 4,331,999 | 5/1982 | Engel et al. | 361/94 |
| 4,420,789 | 12/1983 | Breen | 361/94 |
| 4,428,022 | 1/1984 | Engel et al. | 361/96 |
| 4,603,313 | 7/1986 | Shimp et al. | 335/172 |
| 4,631,625 | 12/1986 | Alexander et al. | 361/94 |
| 5,060,166 | 10/1991 | Engel et al. | 366/93 |
| 5,136,458 | 8/1992 | Durivage, III | 361/93 |
| 5,159,519 | 10/1992 | Cassidy et al. | 361/96 |

OTHER PUBLICATIONS

Purkajastha et al., RMS Digital Trips Offer Increased Accuracy & Reliability Advances in Low Voltage Circuit Breaker Trip Technology, 35th Petroleum & Chemical Industry Conference, Dallas Texas, Sep. 12-14, pp. 157-163. 1988.

*Primary Examiner*—A. D. Pellinen
*Assistant Examiner*—Ronald W. Leja
*Attorney, Agent, or Firm*—Martin J. Moran

[57] ABSTRACT

A microprocessor based switch such as a circuit breaker generates digital rms representations of analog load currents from n samples of the analog currents per cycle synchronized to the line frequency, where n is an odd integer equal to a selected highest order harmonic to be detected plus 2. A routine determines whether the power system is 50 or 60 Hz, and automatically sets the sampling interval to provide exactly n samples per cycle for the connected source. Terminals for rapidly resetting an analog memory for calibration and field testing of a long delay trip are hidden behind a removable rating plug.

9 Claims, 10 Drawing Sheets

ELECTRICAL SWITCHING APPARATUS WITH DIGITAL TRIP UNIT AND AUTOMATIC FREQUENCY SELECTION

CROSS REFERENCE TO RELATED APPLICATION

Commonly owned U.S. patent application Ser. No. 07/954,913 entitled "ELECTRICAL SWITCHING APPARATUS WITH DIGITAL TRIP UNIT AND MEMORY RESET" concurrently filed in the name of Alan B. Shimp.

BACKGROUND OF THE INVENTION

1. Field of the Invention

This invention relates to electrical switching apparatus such as circuit interrupters and contactors having a digital trip unit, and more particularly, to such apparatus usable with both 50 Hz and 60 Hz power systems.

2. Background Information

Circuit breakers are widely used in industrial, commercial and residential applications for protecting electrical conductors and apparatus from damage due to excessive current flow. Initially used as direct replacement for fuses, circuit breakers have been gradually called upon to provide more sophisticated types of protection other than merely interrupting the circuit when the current flow exceeds a certain level. More elaborate time-current trip characteristics have been developed such that a circuit breaker can rapidly open upon very high overload conditions, but delays interruption upon detection of lower overload currents with the time delay being roughly inversely proportional to the degree of overload. Circuit breakers are also available which interrupt upon the detection of ground fault currents. As the complexity of electrical distribution circuits has increased, the control portions of the circuit breaker have been interconnected to provide selective coordination.

During the late 1960's, solid state electronic control circuits were developed for use in high power, low voltage circuit breakers. These electronic control circuits performed functions such as instantaneous and delayed tripping which were traditionally achieved by magnetic-thermal means. The improved accuracy and flexibility of the solid state electronic controls resulted in their wide spread acceptance.

The earliest electronic control circuit designs utilized discrete components such as transistors, resistors and capacitors. More recent designs such as that disclosed in U.S. Pat. No. 4,428,022 have included microprocessors which provide improved performance and flexibility. Due to the severe space limitations in the low voltage circuit breakers, the assignee of this application has developed a special purpose integrated circuit known as a SuRE Chip which incorporates a microcontroller core processor, volatile and nonvolatile memory, and an 8-bit analog to digital converter with a six-input multiplexer which provides all of the essential analog and digital functions in a single monolithic device. This device is described in detail in copending U.S. patent application Ser. No. 07/636,643 filed on Dec. 28, 1990.

These digital systems sample the current waveforms periodically to generate a digital representation of the current waveform. In accordance with the well known Nyquist criteria, a sinusoidal waveform must be sampled at a sampling rate which is greater than twice the frequency to be detected. Higher sampling rates provide the capability of earlier detection of transients such as short circuits. U.S. Pat. No. 5,060,166 suggests sampling the analog currents every 90 electrical degrees, or four times per cycle, to detect changes in amplitude within less than one half cycle. This technique presupposes clean sinusoidal current waveforms.

Recent increase in the use of power conditioning equipment and other non-linear loads has resulted in an increase in the harmonic content of the current waveforms seen by the circuit breaker. A paper entitled "RMS DIGITAL TRIPS OFFER INCREASED ACCURACY AND RELIABILITY ADVANCES IN LOW VOLTAGE CIRCUIT BREAKER TRIP TECHNOLOGY" by Purkajastha et al., 35th Petroleum and Chemical Industry Conference, Dallas, Tex., September 12-14, pages 157-163, addresses this problem and finds that the prior art peak detecting trip units calibrated in rms assuming steady state sinusoidal current can generate nuisance trips due to the harmonics. This paper recommends that harmonics up to the thirteenth be detected and suggests that the analog currents be digitized at a rate of 27 samples per cycle. This sampling rate satisfies the Nyquist criteria of sampling at better than twice the frequency to be detected. However, this high sampling rate places a burden on the microprocessor which, due to space limitations in the circuit breaker casing, has limited processing capability.

With the increasing globalization of markets, circuit breakers must be compatible with the local power systems in different parts of the world. Thus, they must be adaptable for operating at a fundamental frequency of 50 Hz and 60 Hz.

While a sampling rate meeting the Nyquist criteria for 60 Hz power will be adequate for 50 Hz, a single sampling rate synchronized to one frequency will not be synchronized to the other. As will be seen, the sampling rate of the described circuit breaker or contactor must be synchronized to the ac power, whichever the frequency of the source.

The long delay trip function of circuit breakers, and overload protection in contactors, model heating of the load, and interrupt current when predetermined limits are reached. The cooling of the load following interruption of load current is then mimiced so that the load cannot be reenergized until it safe to do so. Circuit breakers and contactors are typically powered by the currents which they interrupt. In the electromechanical analog devices where a bimetal is used to model the heat state of the load, the cooling model is not dependent on power. However, the interruption of load current interrupts the normal operation of microprocessor based circuit breakers and hence their ability to track cooling of the unpowered load. U.S. Pat. No. 5,136,458 teaches forcing the voltage on an external capacitor to track the $I^2t$ load heating characteristic modeled by the microprocessor. When current to the load, and the microprocessor, is interrupted, the capacitor discharges through a resistor selected to bleed the voltage off of the capacitor at a rate which mimics cooling of the load. Another approach has been to charge a memory capacitor when a trip occurs. The voltage on this capacitor is bled and read on power-up so that the microprocessor knows that the trip occurred and shortens the next trip time based on the time since the last trip.

The rate of discharge of these memory capacitors is necessarily very slow. It has been found that this can be a nuisance when calibrating or field testing the circuit breaker or contactor. There is a need for a means for rapidly discharging these memory capacitors for calibration and test purposes, but which is not easily accessible to a user who might try to defeat the normal operation of the protective device and repower the load before it is safe to do so.

SUMMARY OF THE INVENTION

In accordance with the invention, electrical apparatus such as a circuit breaker or contactor connecting a load to an ac power source includes digital means which digitizes the analog load currents at a sampling rate, synchronized to the ac power, of a selected odd integer number of samples per cycle of the ac power, and uses the digitized current samples to generate an rms value of the current for performing various protection functions.

More particularly, the selected odd integer number of samples per cycle is equal to the highest order odd harmonic selected to be detected in the currents plus 2. Thus, 15 samples per cycle are taken synchronously with the ac current to include the 13th harmonic. This reduces the sampling rate by almost half that called for under the Nyquist criteria previously used in these applications.

As the odd number of samples per cycle must be taken synchronously with the ac current, the invention further includes means for automatically setting the sampling interval for synchronous sampling at the odd integer number of samples per cycle for both 50 Hz and 60 Hz power systems, so that the circuit breaker can be used with either frequency system without the need for manual adjustment. In accordance with this aspect of the invention, the number of zero crossings of the current in a known period of time is determined. If this count exceeds a selected threshold, the circuit breaker is being powered by a 60 Hz source and the sampling interval is set accordingly. If the count is below the selected count, the interval is set for synchronous sampling of the 50 Hz source to which the breaker is connected. While this preliminary sampling could always be carried out using a fixed sampling interval, in the preferred embodiment of the invention, the sampling interval last used by the apparatus is employed. The known time period is selected as a fixed number of samples at the stored interval. If the interval for 60 Hz is used in the calculations, a first selected count is used, while a lower selected count is used if the 50 Hz interval is the stored interval.

The present invention is responsive to the higher order harmonics needed for accurate tripping with present day non-linear loads while placing a much lower processing burden on the microprocessor than required by conventional digital switching units. The invention further provides automatic adjustment of the sampling interval to accommodate for both 50 Hz and 60 Hz power systems. This eliminates the need to stock two versions of the apparatus or The need for manual adaptation for the particular power source.

BRIEF DESCRIPTION OF THE DRAWINGS

A full understanding of the invention can be gained from the following description of the preferred embodiments when read in conjunction with the accompanying drawings in which.

DESCRIPTION OF THE PREFERRED EMBODIMENTS

The invention will be described as applied to a low voltage, four pole, molded case circuit breaker. However, it will be realized by those skilled in the art that the invention has application to other types of circuit breakers, and even to other types of electrical switching apparatus, such as electrical contactors including motor starters.

Figure 1:
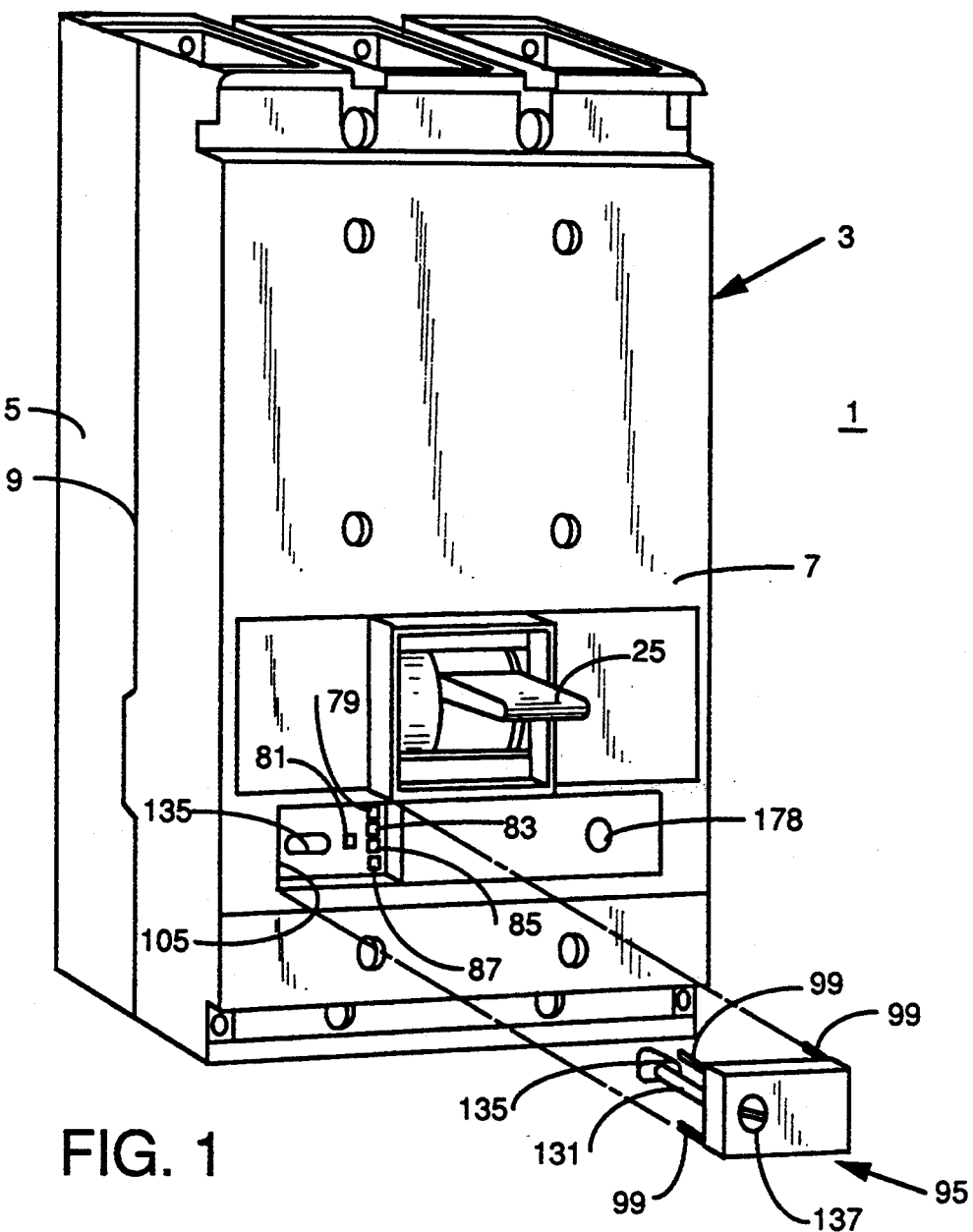
FIG. 1 is a isometric view of a circuit breaker incorporating the invention with the rating plug shown removed from the casing.

Referring to FIGS. 1 and 2, the molded case circuit breaker, generally identified with the reference numeral 1, includes an insulated housing 3, formed from a molded base 5 and a molded cover 7, assembled at a parting line 9. The circuit breaker 1 is connected through line terminals 11A, B, C, and N to an electrical power system 13, and through load terminal 15A, B, C and to a load 17. Separable contacts 19A, B, C and N in internal conductors 21A, B, C, and N complete a circuit between the line terminals 11 and load terminals 15 when closed, and interrupt current flow to the load 17 when open. The contacts 19 are controlled by a circuit breaker mechanism 23 such as is shown in copending application U.S. patent application Ser. No. 07/779,441, filed Oct. 18, 1991 and entitled MOLDED CASE CURRENT LIMITING CIRCUIT BREAKER. This operating mechanism 23 can be controlled manually by a handle 25 on the front of the circuit breaker housing (see FIG. 1). The operating mechanism 23 is actuated automatically by a shunt trip unit 27, such as for instance, the shunt trip unit described in copending application U.S. patent application Ser. No. 07/708,328, filed May 31, 1991 and entitled CIRCUIT FOR CONTROLLING THE ORIENTATION OF A MAGNETIC FIELD.

The shunt trip unit 27 is controlled by signals applied to terminals 29 which are connected to an electronic trip unit 31. The heart of the electronic trip unit 31 is a custom integrated circuit 33 known as a SuRE Chip. The SuRE Chip incorporates a microcontroller core processor such as a Motorola MC68HC05-35 with 2K bytes of program memory and 128 bytes of user RAM 36. An additional 256 bytes of nonvolatile RAM (NVRAM) in the form of an EEPROM 37 are also provided. An 8-bit analog to digital converter subsystem 39 having a 6-input multiplexer and 4-bit prescaler provides a dynamic range of 12-bits with a conversion time of 48 $\mu$s. The SuRE Chip 33 provides all of the essential analog and digital functions in a single monolithic device. The details of the SuRE Chip are set forth in U.S. patent application Ser. No. 07/636,643 which is herein incorporated by reference.

The electronic trip unit 31 provides a selection of protective functions. These include a hardware override trip, instantaneous protection, short delay protection, fourth-pole or ground fault protection (not shown), long delay protection, and over temperature protection. All except the override trip and over temperature protection are based upon true rms values of current.

The electronic trip unit 31 includes current transformers 39A, B, C, N which generate secondary currents representing phase currents $i_A$, $i_B$ and $i_C$ and neutral current $i_N$ flowing in the internal conductors 21A, B, C, N. The secondary currents generated by the current transformers 39 are fullwave rectified by on-board rectifiers 41A, B, C, N. Each of these rectifiers 41 produces a negative going voltage across a current sensing resistor 43A, B, C, N. In addition, each current flows through a capacitor 45 to develop 70 vdc power supply. Excess secondary current is bypassed by a FET 47 under control of the SuRE Chip 33 which monitors the 70-volt supply via sense circuitry composed of zener diode 49 and resistors 51 and 53 through the BSEN input. The SuRE Chip turns on the FET 47 through the BDR output. A circuit 55 which includes transistor 57 and capacitor 59 generates a 5 volt supply also under control of the SuRE Chip 33. Details of these supply and reference circuits are provided in the above referenced application on the SuRE Chip IC.

Each of the negative going voltages across the resistors 43A, B, C, N is converted by a resistor 61A, B, C, N, respectively, into a current analog which is sourced from and digitized via SuRE Chip input MUX0, MUX1, MUX2, or MUX3.

In addition, the four negative going voltages representing the phase current, are auctioneered by the diodes 63A, B, C, N. A very large current in any phase will produce a very large negative going voltage at the common junction 65. This in turn will pull the CPO input to the SuRE Chip 33 below its threshold causing a hardware override trip. A voltage divider formed by the resistors 67 and 69 and zener diode 71 determines the secondary current level at which this occurs. This hardware override type feature provides protection against very large currents which must be interrupted immediately and cannot wait for the processing time of the SuRE Chip 33.

In the implementation of the long delay protection function, the circuit breaker 1 mimics the heating of the load connected to the circuit breaker which includes the wiring. This includes cooling of this load after the current is interrupted. This feature prevents reenergizing the load until the digitally modelled heat state signal indicates that the load has cooled to a safe level. This digitally modelled heat state signal is a representation of $I^2t$ heating of the load. A memory capacitor 73 is forced to track the internal digital representation of $I^2t$ heating generated by the long delay trip function. This capacitor 73 stores an analog equivalent of the digital heat state signal. When the breaker trips and the SuRE Chip is deenergized, the thermal memory capacitor 73 discharges through the resistor 75. The value of the resistor 75 is selected so that the capacitor 73 discharges at a rate which models the cooling rate of the load. Upon power up, the internal digital representation of $I^2t$ heating is preset in proportion to any voltage remaining on the capacitor 73. In this way, the electronic trip unit 31 models the cooling of the load after a trip event. It may require several minutes before the load is cooled sufficiently that it may be reenergized. While this performs a valuable protective function, it can be a nuisance when the circuit breaker is being tested or calibrated.

Alternatively, the memory capacitor 73 can be charged to a preset value upon tripping of the circuit breaker. The resistor 75 bleeds charge on the capacitor 73 so that the decaying capacitor voltage provides a representation of time since the trip. Upon power-up, the voltage on the capacitor is read by the microprocessor 35 and used to shorten the next trip time based on the time since the last trip. Again, this memory capacitor performs an important protective function, but can be a nuisance during testing or calibration of the circuit breaker.

In accordance with the invention, a second resistor 77 is connected in parallel with the resistor 75 across the capacitor 73. The resistor 77 is connected to a test point terminal 79. By connecting the test point terminal 79 with a grounded terminal 81, the capacitor 73 can be rapidly discharged through the resistor 77, the value of which is selected to reset the memory capacitor 73 at a substantially more rapid rate than is effected by the resistor 77.

Other test point terminals 83, 85 and 87 can be accessed to disable the long delay feature, verify the long delay trip threshold and the short delay trip threshold, through resistors 89, 91 and 93, respectively.

As will be more fully explained below, all of the test point terminals 79–87 are located behind a rating plug 95. The rating plug 95 has a resistor 97 which is connected through pin connections 99 between ground and an input MXO of the A/D converter 39. The resistor 97 when the plug is in place is in series with a resistor 101. The plug 95 is removably received in a recess 105 in the front panel of the circuit breaker 1 as seen in FIG. 1. The frame size of the circuit breaker, which is the maximum continuous current that the circuit breaker is designed to carry is established by the resistor 101. In a particular installation, it may be desirable to establish a maximum continuous current which is less than that permitted by the frame size. The removable rating plug 95 permits altering of this maximum continuous current by inserting the rating plug 95 with the appropriate valued resistor 97.

A pair of rotary switches 107 and 109 permit the user to select one of eight settings for short delay or instantaneous pickup (current level), and short delay time, respectively. The switches 107 and 109 share pull-up resistors 111 with the active switch being selected by the PC4 and PC5 outputs of the SuRE Chip 33.

Synchronous serial input/output port (SSIOP) communications are available at SDO pin 113, SDI pin 115, SCK pin 117 and a ground pin 119. This link is capable of transmitting the entire contents of volatile and non-volatile RAM and is also capable of accepting data for storage in EEPROM. This serial communications facility is used for factory calibration of the circuit breaker. During normal operation, the SSIOP periodically transmits two bits which identify the option selection and code version.

The SuRE Chip 33 monitors the phase currents and the various parameter settings and generates, as appropriate, instantaneous, short delay, and long delay trip signals. It also generates a trip signal in response to the hardware override trip discussed above. The SuRE Chip 33 actuates the shunt trip 27 by turning on an SCR 121. The resistors 123 and 125 in capacitor 127 provide noise suppression for the SCR 121.

Figure 2A:
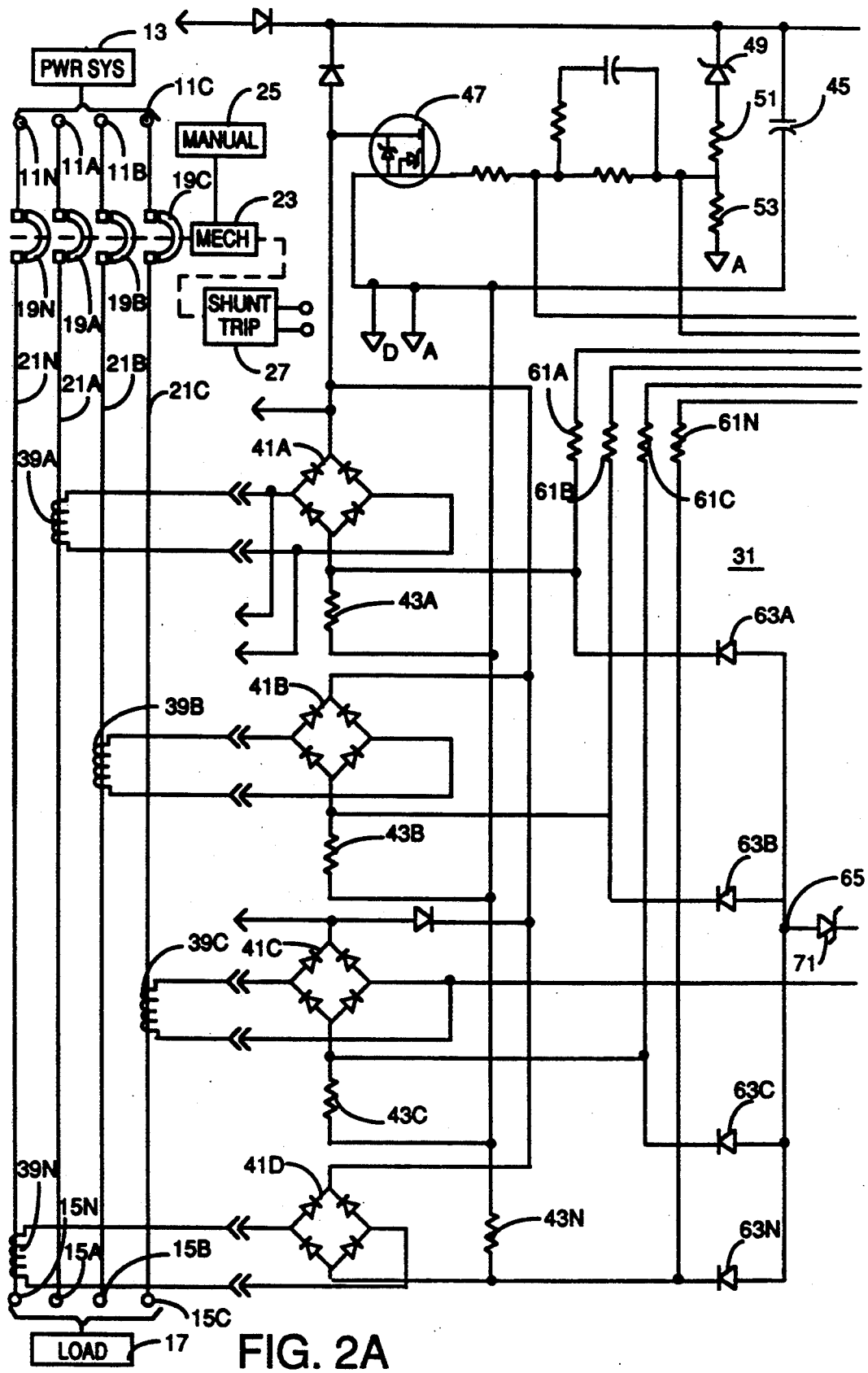
FIGS. 2A-C together illustrate a schematic circuit diagram of the circuit breaker of FIG. 1.
Figure 2B:
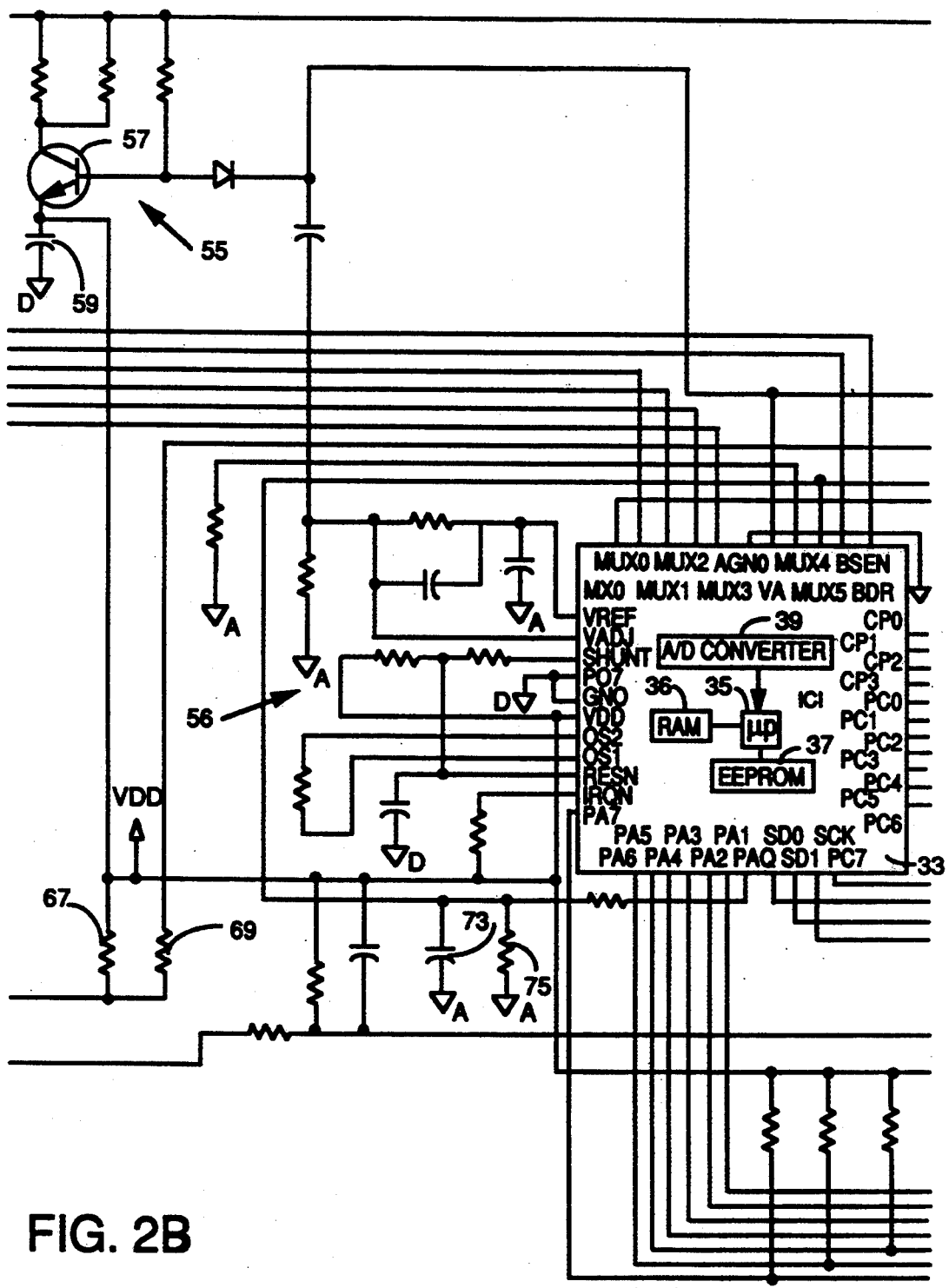
Figure 2C:
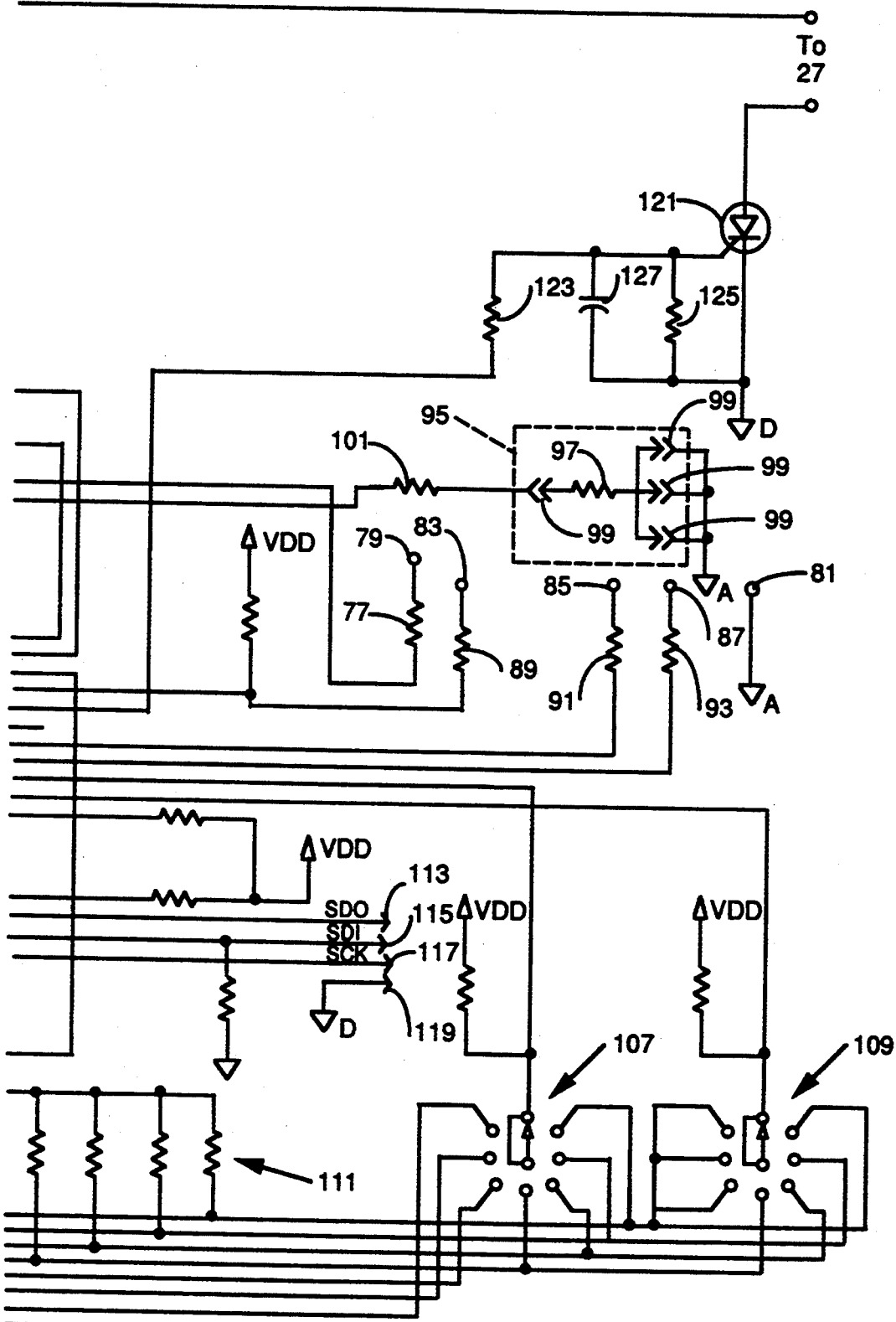

Returning to FIG. 1, with the rating plug 95 removed, it can be seen that a printed circuit board 129 on which the electronic components of FIG. 2 are mounted is located under the cover 7 of the circuit breaker housing 3. The rating plug 95 has a stem 131 with a locking lug 133 on the end which extends through an opening 135 in the printed circuit board. The removable rating plug 95 is locked into the circuit breaker by inserting a screw driver in a slot 137 in the stem 131 and rotating the stem to engage the locking lug 133 in the circuit breaker. With the plug 95 in place, the pin connections 99 engage sockets (not shown) in the printed circuit board 129 to insert the rating resistor 97 into the circuit as described in connection with FIGS. 2A–C. It can also be seen in FIG. 1 that the test point terminals 79–87 are mounted on the printed circuit board 129 in alignment with the recess 105 in the front cover of the circuit breaker. Thus, these test points are only accessible when the rating plug 95 has been removed. Thus, for factory calibration or field testing of the memory feature, the rating plug 95 is removed and a jumper is placed between the test point terminals 79 and 81 to rapidly discharge the memory capacity 73.

As previously discussed, the secondary analog currents representative of the load and neutral phase currents are digitized by the analog to digital converter 39 for input to the SuRE Chip 33. As also discussed, the current practice is to sample the analog signals for digitizing at the Nyquist rate which is more than twice the frequency of the highest order harmonic to be detected. Thus, the above referenced paper suggests as that a sampling rate of 27 samples per cycle be taken to detect the thirteenth harmonic.

Figure 3:
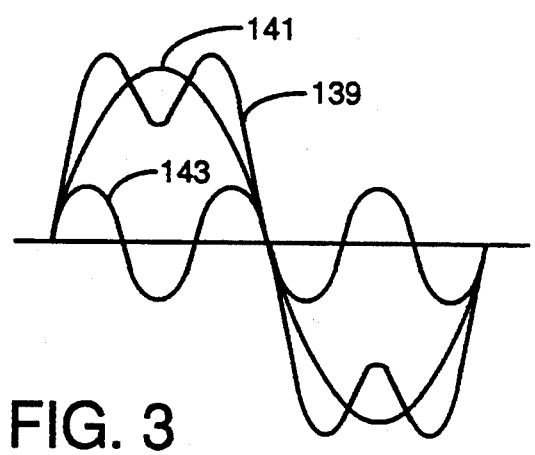
FIG. 3 is waveform diagram illustrating the principle of operation of one aspect of the invention.

We have discovered that the higher order harmonics created by non-linear loads can be detected at much lower sampling rates under the conditions that exist in electric power systems. These non-linear loads introduce only odd harmonics into the power systems wave forms. The presence of only odd harmonics produces odd symmetry in the wave forms. Thus, as shown in FIG. 3, the wave form 139 resulting from the presence of the fundamental frequency 141 and the third harmonic 143 is symmetrical in the positive and negative half cycles. By synchronously sampling the analog currents, an odd number n+2, times per cycle, we can detect the nth harmonic. Thus, the thirteenth harmonic can be detected by sampling at a rate of fifteen samples per cycle. This reduces the processing burden on the circuit breaker microprocessor by almost half over the Nyquist criteria. By sampling synchronously, it is meant that the sampling interval is divisible into the fundamental frequency period an exact integer number of times, and since we are sampling an odd number of times per cycle, this integer must be odd. However, the phase of the sampling frequency can be random with respect to the fundamental frequency of the ac signal being digitized.

Actually, we have found that by sampling the load currents synchronously at an odd number of times, and calculating the rms currents therefrom, we can detect all harmonics, odd and even, in the currents up to the sampling rate minus 2. For example, at a sampling rate of 15 times per cycle, the 2nd through 13th harmonics are detected.

The digitized current samples are utilized by the SuRE Chip 33 to generate digital rms currents. For instantaneous and short delay trips, fifteen samples (samples taken in one cycle) are used for the rms calculation. For the long delay trip calculation, 240 samples (samples taken over sixteen cycles), are used as more time is available to analyze the currents. The 240 sample rms values are transmitted over the SSIOP communications link to calibration equipment for use in the calibration procedure. The sampling, squaring, and summing tasks characteristic of true rms computation are performed by an interrupt routine. At 60 Hz, one set of A/D conversion on $i_A$, $i_B$, $i_C$ and $i_N$ are performed every $16.67/15 = 1.111$ ms. The squaring and summing of each sample is accomplished during the 48 $\mu$S A/D conversion time of the next sample. Timekeeping relies upon the count of interrupts. All other tasks are performed in a main routine and are subject to interruption. To prevent the data that is being operated upon by the main routine from being modified by the interrupt routine (data tearing), the main routine operates only on data that was gathered during the previous cycle and buffered by the interrupt routine.

Figure 4A:
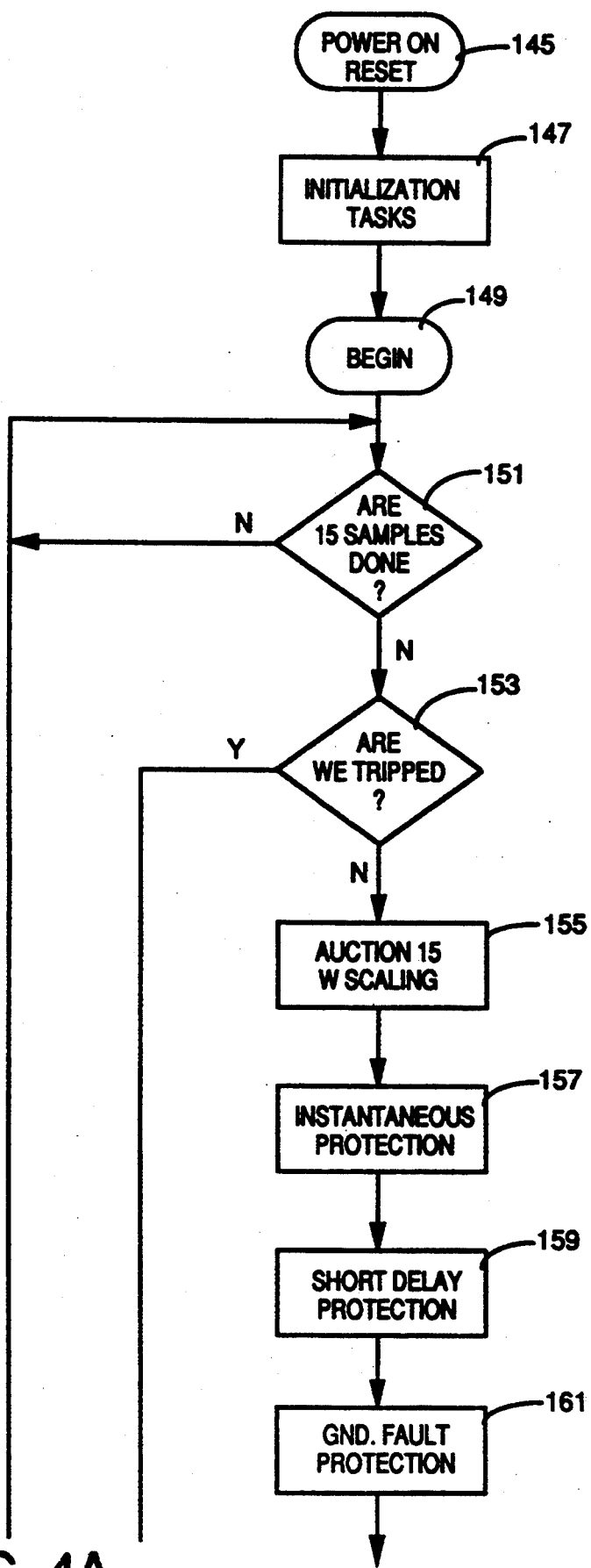
FIGS. 4A-C illustrate a flow chart of a main program for the processor which forms part of the circuit breaker of FIG. 1.
Figure 4B:
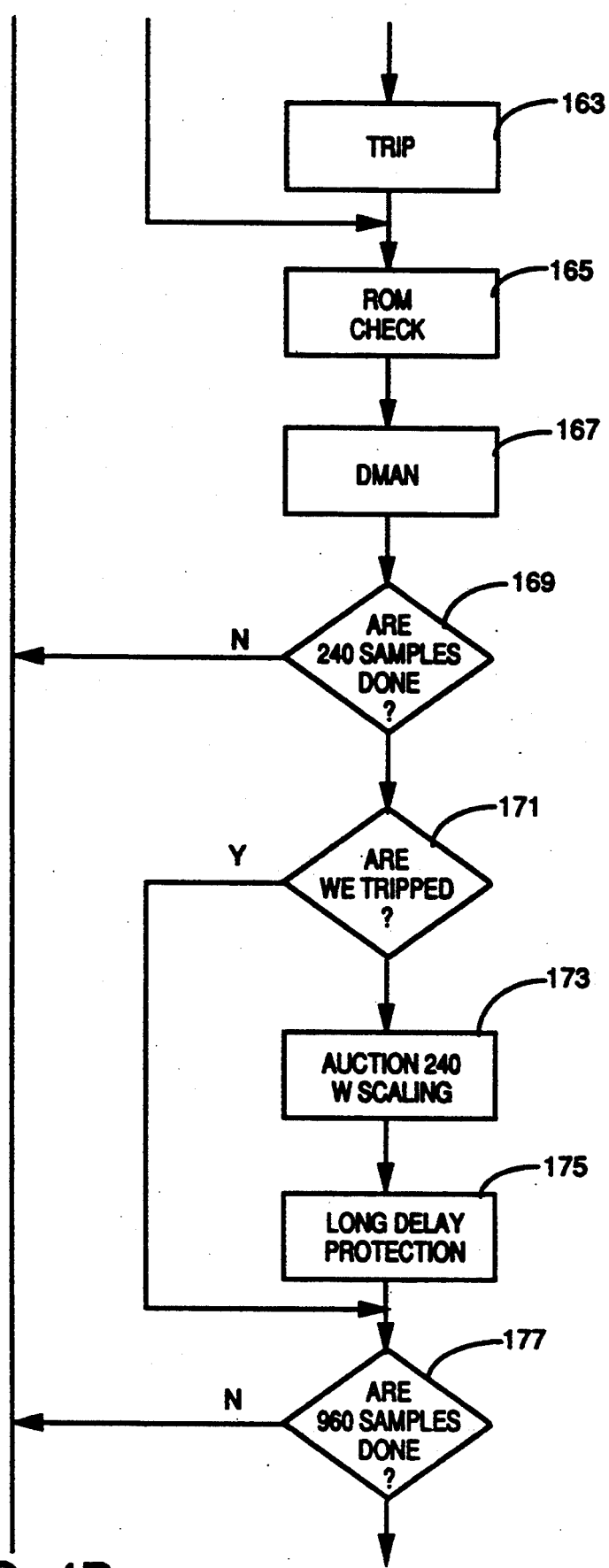
Figure 4C:
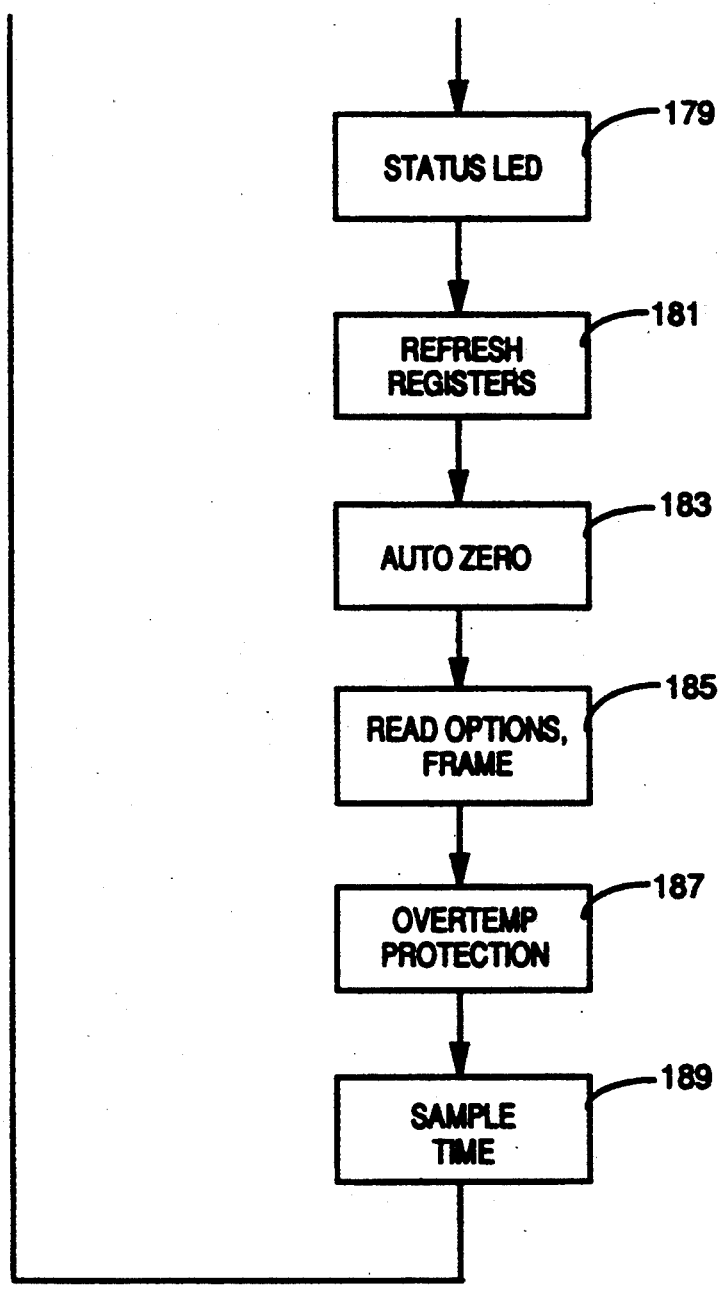

FIG. 4 illustrates a flow chart for the main routine run by the microprocessor 35. When power is first applied to the circuit breaker at 145, initialization tasks are performed at 147 and then the main loop is begun at 149. The routine waits at 151 until 15 current samples have been accumulated. If the breaker has not been tripped as determined at 153, the separate currents are scaled and the current of greatest magnitude is selected at 155. An instantaneous protection routine 157, a short delay protection routine 159, and, if provided, a ground fault protection routine 161, are called in sequence To set flags if the criteria for the instantaneous, short delay or ground fault trips have been exceeded. If any of these flags have been set, a trip signal is generated at 163 which turns on the SCR 121 to actuate the shunt trip mechanism 27, which opens the circuit breaker contacts 19. Following generation of the trip signal at 163, or if the breaker is already in a trip condition, ROM checks and deadman checks are performed at 165 and 167, respectively.

The main program cycles through the loop just described until 240 samples have been accumulated as determined at 169. If the breaker is not tripped as determined at 171, the appropriately scaled rms current calculated from 240 samples for the largest phase current is selected at 173 and used by the long delay protection routine at 175 to determine if the breaker should be tripped. The long delay protection routine 175 sets a trip flag which is implemented to generate a trip signal at 163 after 15 new samples have been accumulated. As this only represents one cycle, it is insignificant with respect to the long delay trip time. This larger loop is repeated until 960 samples have been accumulated as indicated at 177. When this occurs, the state of a status LED 178 on the front of the breaker (see FIG. 1) is changed at 179. On alternate executions of this routine, the status LED 178 is turned on and off. As this routine is run about every second, the status light blinks on and off at this rate to provide an indication the circuit breaker is functioning.

Next, the parameters in registers in RAM 36 are refreshed from nonvolatile ROM 37 as indicated at 181. An auto zero routine is then run at 183 to reinitiate an auto zeroing function in the A/D converter 39. Following this, two bytes in nonvolatile memory, OPTIONS and FRAME, are reread into RAM. The bits of the OPTIONS byte indicate selection of various optional features of the circuit breaker such as long delay, short delay, instantaneous trip and ground fault protection.

The FRAME byte indicates the frame size of the breaker.

The SuRE Chip 33 has a diode (not shown) which is used to monitor the temperature of the chip. An over-temperature protection routine is run at 187 to check the temperature of the SuRE Chip and trip the circuit breaker if a temperature limit is exceeded. The last function implemented by the main routine is a sample time routine run at 189. This routine, which automatically determines whether the power system in which the breaker is connected is 50 Hz or 60 Hz, is described in connection with FIGS. 6 and 7.

Figure 5A:
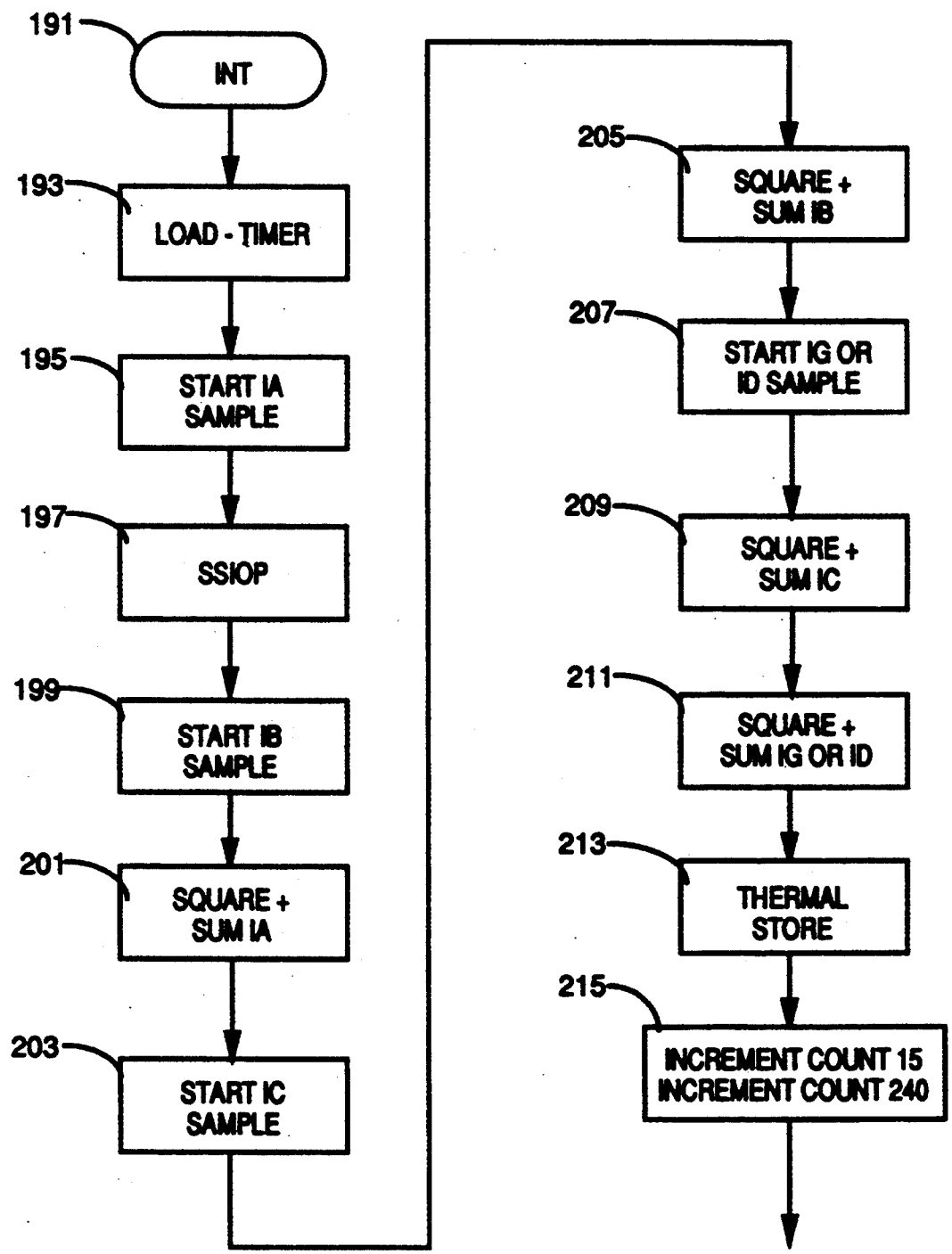
FIGS. 5A and B illustrate a flow chart of an interrupt routine for digitizing currents monitored by the circuit breaker.
Figure 5B:
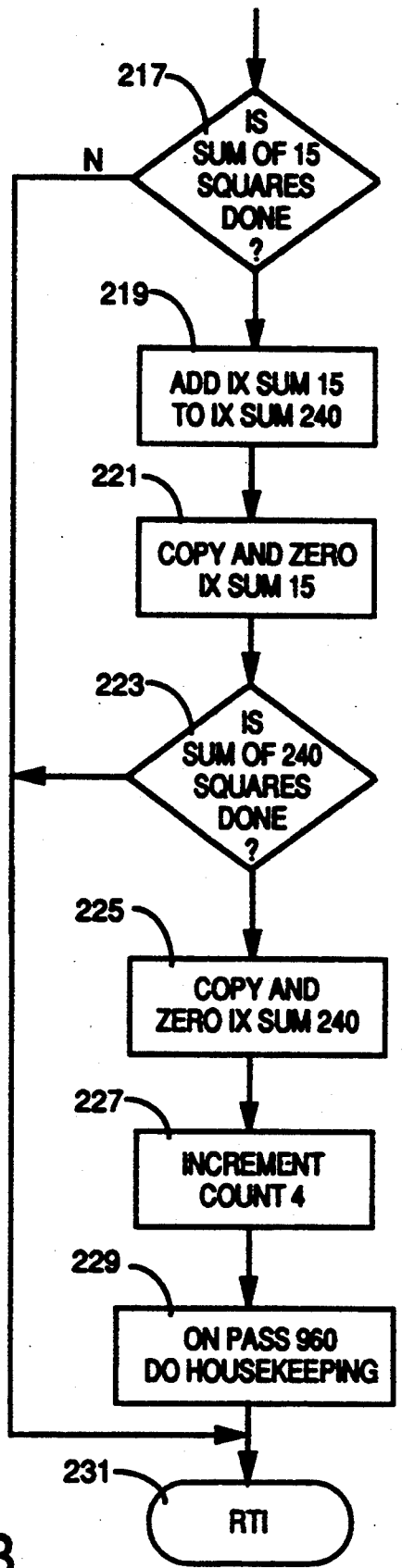

FIG. 5 illustrates the interrupt routine for the main program. This routine is entered at 191 fifteen times per line cycle. Upon entering the interrupt routine, a timer is loaded is at 193 for generating the next interrupt. For 60 Hz, this interval is 1.111 ms, for 50 Hz it is 1.333 ms. The A/D conversion of the phase A current is then initiated at 195. While this is being carried out, serial communications are performed at 197. By this time, the A/D conversion of phase A is completed and digitizing of phase B current is initiated at 199. While this occurring, the phase A digitized current is squared and added to a sum of the phase A squared current at 201. Next the A/D conversion of phase C is initiated at 203 and the phase B current is squared and the result summed at 205. When this has been completed, the neutral phase current or ground fault current, if that option has been selected, is digitized at 207. The phase C and neutral or ground fault currents are then summed and the results squared at 209 and 211. Following this, the $I^2t$ heat state signal stored on the capacitor 75 is updated at 213. Counts for determining when 15 samples and 240 samples have been accumulated are then incremented at 215. Until the sum of squares of 15 samples has been accumulated as determined at 217, the routine returns to the program which was interrupted at 231.

When the sum of squares of 15 samples has been accumulated as determined at 217, the sum of the squares of each sample for each of the phases A–C, and N is added to accumulated sums of the squares maintained for 240 samples at 219. The sum of the squares for 15 samples for each of the phases is then copied at 221 into buffers for use by the main routine and the working count is zeroed. If the sum of the squares for 240 samples has not yet been accumulated at 223, the routine returns to the program interrupted at 231.

When the sum of the squares for 240 samples has been accumulated as determined at 223, the sum of the squares for 240 samples for each of the phases is copied into buffers at 225 and the working counts are zeroed for the next sampling. A count is then incremented at 227. Every 960 timing intervals, which is established when the count at 227 reaches four ($4\times240=960$), housekeeping chores are performed at 229 before the routine returns to the program which was interrupted at 231.

Figure 6:
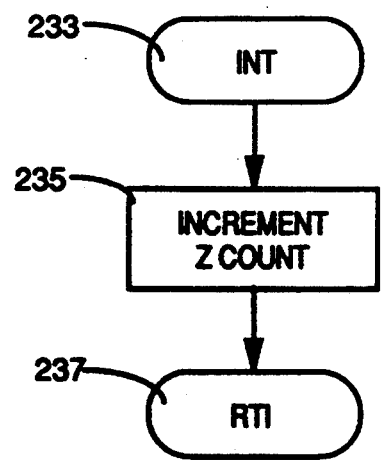
FIG. 6 is a flow chart of a routine for counting zero crossings.

FIG. 6 illustrates a short routine which is initiated by a zero crossing of one of the phase currents monitored, which in the exemplary circuit breaker is phase C. The positive zero crossings of phase C current generates an interrupt at 233 which increments a Z count at 235. The program then returns to the routine that was being run at 237.

Figure 7:
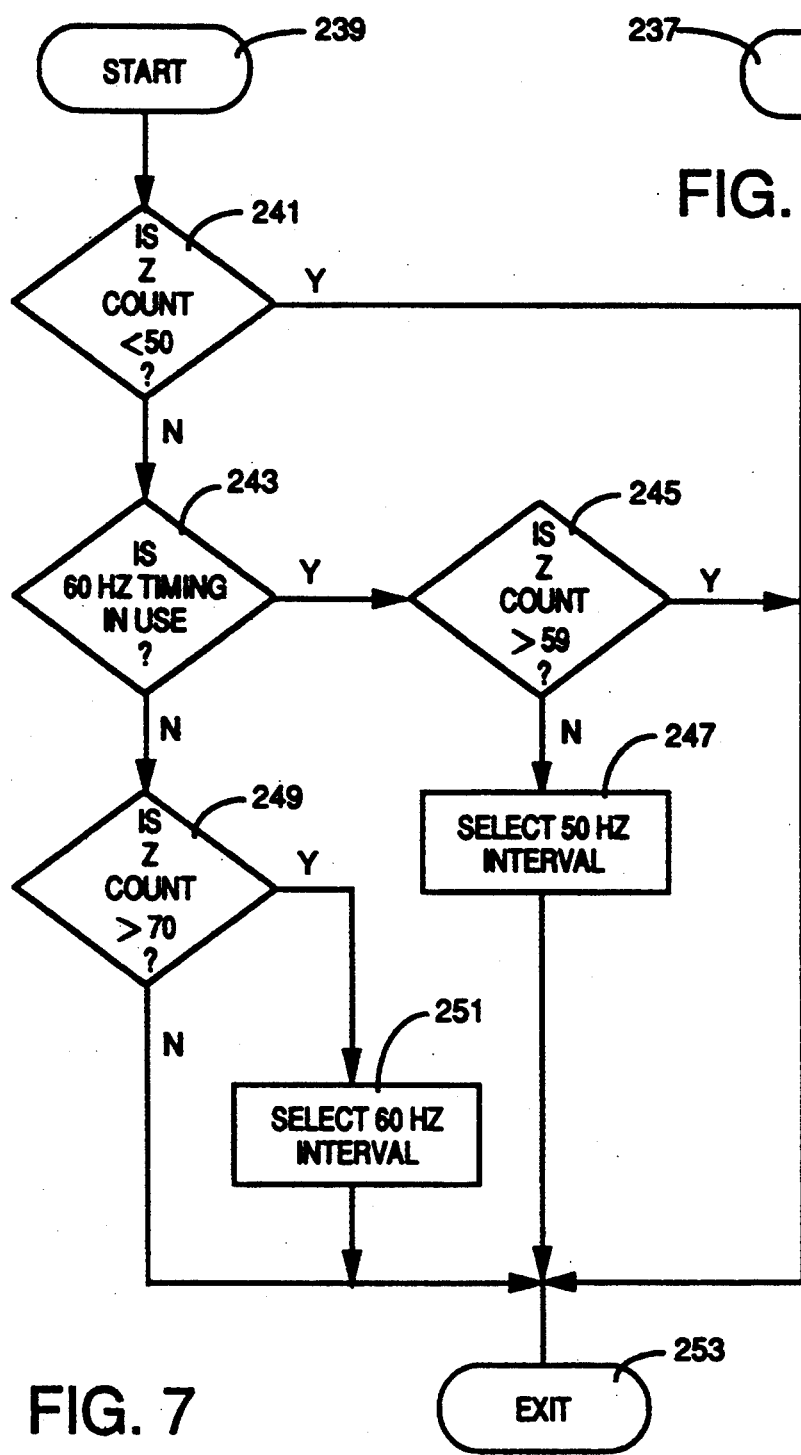
FIG. 7 is a flow chart of a routine for selecting the sampling interval.

FIG. 7 illustrates the sample time routine 189 in the main program. This routine is called every 960 samples (1.066 seconds). It automatically selects the correct sampling interval for the frequency of the power system in which the circuit breaker is being used. As will be recalled, the monitored analog currents must be sampled synchronously at an odd number of samples per cycle. While different sampling rates could be used for 50 and 60 Hz power systems, these sampling rates must still be synchronous and generate an odd number of samples per cycle. It is convenient for the sake of the software to have the same odd number of samples per cycle generated for power systems of both frequencies. In the exemplary circuit breaker in which 15 samples are generated per cycle, the sampling interval is 1.111 ms for 60 Hz and 1,333 ms for 50 Hz.

In order to determine the frequency of the power system to which the circuit breaker is connected, the number of zero crossings in a known time period are counted. This known time period is selected to be long enough to easily discriminate between 50 Hz and 60 Hz line frequencies taking into account the possibility of miscounts and other anomalies. One possibility is to default the time interval to the value for either 50 Hz or 60 Hz and count the number of zero crossings occurring during a given number of sampling intervals. In the exemplary embodiment of the invention, the interval last used by the circuit breaker, which may be the value set during calibration for a new circuit breaker, is used in the determining the line frequency. The number of zero crossings during a fixed number of sampling intervals is then counted and compared with threshold values. In the exemplary system, the number of positive going zero crossing in 960 sample intervals is counted. For the 1.111 ms sample interval, 960 samples will occur in 1066.8 ms. The number of positive going 60 Hz zero crossings in this time period is 64 while the number of positive going 50 Hz zero crossings in this time period is 53. A count midway between these two counts is then selected to account for possible missed counts and other anomalies. In the exemplary system, the selected count is 59. If the positive going crossings exceed 59, the monitored signal is 60 Hz and a sample interval of 1.111 ms is selected. If the crossings are less than or equal to 59, the monitored signal is a 50 Hz signal and the sampling interval is set to 1.333 ms.

If the frequency test is run utilizing the 1.333 ms sampling interval, 960 samples will occur in 1280 ms. During this time interval, 64 positive going 50 Hz zero crossings and 76 positive going 60 Hz zero crossings will occur. Again, a count of 70 midway between these two counts is selected as the reference. If the positive going crossings exceed 70, the monitored signal is 60 Hz and the 1.111 ms interval is selected. If the crossings are less than or equal to 70, the 1.333 interval for 50 Hz signal is selected.

FIG. 7 illustrates a flow chart for the sample time routine. This routine is called at 239 by the main program at 189 each time 960 samples have been accumulated. When the program is called at 239 in FIG. 7, if the zero crossing count is less than 50, as determined at 241, the data is unreliable and the program is exited at 253. If the data appears to be reasonable, and the 1.111 ms sampling interval associated with 60 Hz power was used to generate the samples, as determined at 243, and the count of zero crossings is more than 59 as determined at 245, a 60 Hz signal is being monitored and the correct timing interval is being used. Hence, the program is exited at 253. However, if the count is less than or equal to 59, the monitored current is a 50 Hz signal and the 50 Hz interval of 1.333 ms is selected at 247.

If it was determined at 243 that the interval for 50 Hz timing was used to gather the samples, and the count is not more than 70 as determined at 249, the monitor power is 50 Hz and the correct timing interval is being used. On the other hand, if the zero crossing count is more than 70 at 249, the 60 Hz timing interval of 1.111 ms is selected at 251.

While specific embodiments of the invention have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the invention which is to be given the full breadth of the appended claims and any and all equivalents thereof.

What is claimed is:

1. Electrical apparatus for connecting a load to either of a 50 Hz power source and 60 Hz power source, said apparatus comprising:

separable contacts selectively connecting said load to the power source when closed and disconnecting the load from the power source when open;

sensing means sensing current flowing through said separable contacts to the load when said contacts are closed;

digital control means including digitizing means digitally sampling said current sensed by said sensing means at a selectable time interval to generate digital current signals, means responsive to predetermined values of said digital current signals to generate a trip signal, and means responsive to said digital current signals to set said selectable time interval for use by said digitizing means to digitally sample said currents a common number of samples per cycle for both a 50 Hz power source and a 60 HZ power source; and means responsive to said trip signal to open said contacts.

2. The electrical apparatus of claim 1 wherein said means setting said selectable time interval comprises:

means accumulating an accumulated count of zero crossings of said current in a known period of time; and means setting said selectable time interval to a first value for use by said digitizing means to sample said currents at said common number of samples per cycle for a 60 Hz power source when said accumulated count is more than a preselected count, and setting said selectable time interval to a second value for use by said digitizing means to sample said currents at said common number of samples per cycle for a 50 Hz power source when said accumulated count is less than said preselected count.

3. The electrical apparatus of claim 2 wherein said preselected count is a count about midway between said accumulated count of zero crossings for a 50 Hz power source during said known period of time and a said accumulated count of zero crossings for a 60 Hz power source during said known period of time.

4. The electrical apparatus of claim 2 wherein said digital control means includes means storing said selectable time interval last selected and upon start-up selecting the stored selectable time interval for use by said digitizing means, wherein said known period of time is a preset multiple of said stored selectable time interval, and wherein said preselected count is a first preselected count when said stored selectable time interval is of said first value, and is a second preselected count when said storage selectable time interval is of said second value, and including means changing said selectable time interval from said first value to said second value when said accumulated count is less than said first preselected count, and changing said selectable time interval from said second value to said first value when said accumulated count is greater than said second preselected count.

5. The electrical apparatus of claim 4 wherein said first and second preselected counts are midway between accumulated counts of zero crossings for a 50 Hz power source and 60 Hz power source during said known of time period for said first and second values of said selectable time intervals respectively.

6. The electrical apparatus of claim 4 wherein said common number of samples per cycle is an odd integer, and said digitizing means takes said samples synchronously with the sensed current.

7. The electrical apparatus of claim 6 wherein said odd integer is 15.

8. The electrical apparatus of claim 7 wherein said known period of time is about one second.

9. The electrical apparatus of claim 6 wherein said equal number of samples per cycle is equal to a selected highest odd harmonic to be detected in the current plus two.

* * * * *